United States Patent [19]

Lin

[11] Patent Number: 5,424,693
[45] Date of Patent: Jun. 13, 1995

[54] SURFACE MOUNTABLE MICROWAVE IC PACKAGE

[75] Inventor: Chao-Hui Lin, Taichung, Taiwan, Prov. of China

[73] Assignee: Industrial Technology Research Institute, Hsinchu, Taiwan, Prov. of China

[21] Appl. No.: 3,729
[22] Filed: Jan. 13, 1993
[51] Int. Cl.⁶ .............................. H01P 5/00
[52] U.S. Cl. ...................... 333/33; 333/247; 333/246
[58] Field of Search ............... 333/33, 238, 246, 247; 257/664, 728

[56]           References Cited
       U.S. PATENT DOCUMENTS

| 3,093,805 | 6/1963 | Osifchin et al. | 333/238 X |
| 5,057,798 | 10/1991 | Moye et al. | 333/238 X |
| 5,229,727 | 7/1993 | Clark et al. | 333/238 X |
| 5,294,897 | 3/1994 | Notari et al. | 333/33 |

Primary Examiner—Paul Gensler
Attorney, Agent, or Firm—H. C. Lin

[57] ABSTRACT

A surface mountable microwave IC package with broad bandwidth and low loss has been developed. The impedance mismatch due to the electrical discontinuity of the I/O pads and via holes in the structure is compensated. The compensation structure has two features. In one feature, ground planes are printed on both sides of a dielectric substrate to increase the distributed capacitance between the signal line and the ground, thereby obtaining a matched characteristic impedance. In the second feature, two grounding via holes are used to compensate for the mismatch of the charactersitic impedance due to the feedthrough via-slot connection of the signal line from the back-side to the front-side of the substrate.

6 Claims, 4 Drawing Sheets

SURFACE MOUNTABLE MICROWAVE IC PACKAGE

BACKGROUND OF THE INVENTION

1. Field of the Invention

The present invention relates to integrated circuit (IC) packages, and more particularly to a surface mountable microwave IC package which provides high performance with a very low cost.

2. Description of the Prior Art

The performance of microwave gallium-arsenide (GaAs) integrated circuits is limited by the package in which the ICs are mounted. Typical packages with a reasonable cost, such as the one described in U.S. Pat. No. 5,014,115 issued May 7, 1991, entitled "COPLANAR WAVEGUIDE SEMICONDUCTOR PACKAGE" by Lester J. Moser, are usually limited in operating frequency, from DC to several gigahertz. Their functions and performance, such as surface mountability, loss, size, and other characteristics, leave much to be desired. High performance packages, such as the Hypcon described in U.S. Pat. No. 4,255,003 issued Mar. 10, 1981 entitled "ELECTRICAL CONNECTOR" by William E. Berg and the one described in U.S. Pat. No. 4,626,805 issued Dec. 2, 1986 entitled "SURFACE MOUNTABLE MICROWAVE IC PACKAGE" by Keith E. Jones, are very complex and expensive. The Jones package is preferred among international products. Its operating frequency extends from DC to twelve gigahertz, but the cost is very high.

What is desired is a low cost, high performance, miniature size, surface mountable GaAs microwave IC carrier.

SUMMARY OF THE INVENTION

An object of this invention is to provide a high performance, surface mountable microwave IC package with broad bandwidth and low loss. Another object is to provide a low cost microwave IC package. Still another object is to provide a package which does not require expensive brazing and thin-film techniques.

These objects are achieved by using thick-film technique Distributed capacitance is used to compensate for the impedance mismatch due to the I/O pads and the via holes, yielding a matching impedance of 50 ohms directly. Lumped capacitance-inductance matching technique is not used to avoid forming a low-pass filter, which limits the frequency response. This structure results in perfect impedance matching and broad bandwidth.

BRIEF DESCRIPTION OF THE DRAWINGS

FIG. 6(c) shows a compensated via-slot structure.
FIG. 6(d) shows a pseudo-CPW structure.

DESCRIPTION OF THE PREFERRED EMBODIMENT

Figure 3:
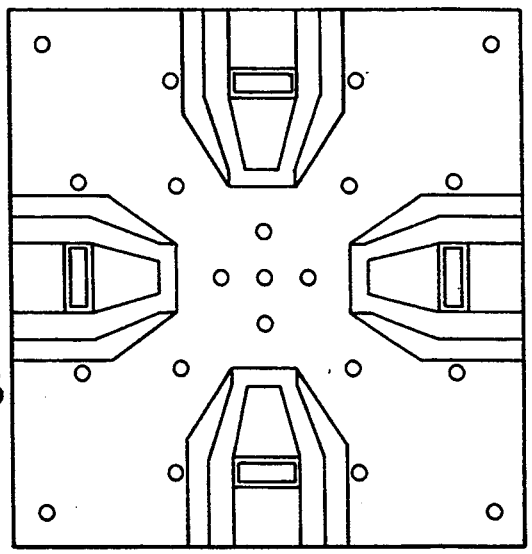
FIG. 3 shows the overlay of the front-side layout and the back-side layout.
Figures 4A, 4B:
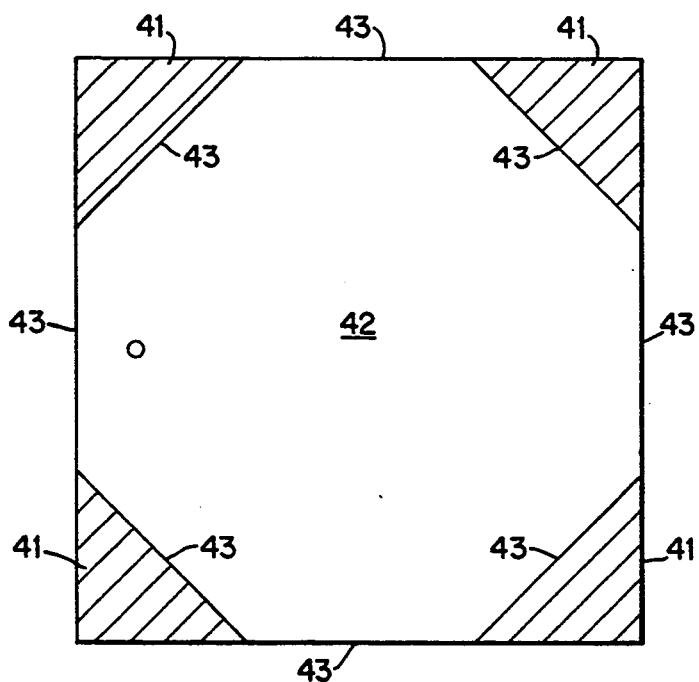
FIG. 4(a) shows the top-view of the metal cap and FIG. 4(b) shows the side-view of the metal cap.

The structure of this invention has two parts. One part is the main body as shown in FIG. 3. The other part is a metal cap as shown in FIG. 4(a) and 4(b), which is adhered to the main body to prevent electro-magnetic interference. The main body is composed of three layers: (a) a dielectric substrate with via-holes in it; (b) printed circuits on the front side of the substrate as shown in FIG. 1, and (c) printed circuits on the back-side of the substrate as shown in FIG. 2.

The structure can be divided into two electrical parts: (a) the input/output (I/O) ports of the package (1, 2, 3, 4 in FIG. 1 and FIG. 2); (b) the ground plane which supports both the ground connection for a monolithic microwave IC (MMIC) and an impedance compensation structure. The number and the location of the I/O ports depend on the application. As an example, a four-port structure is described here for use to package a MMIC low noise block (LNB) in a direct broadcast system (DBS).

Figure 1:
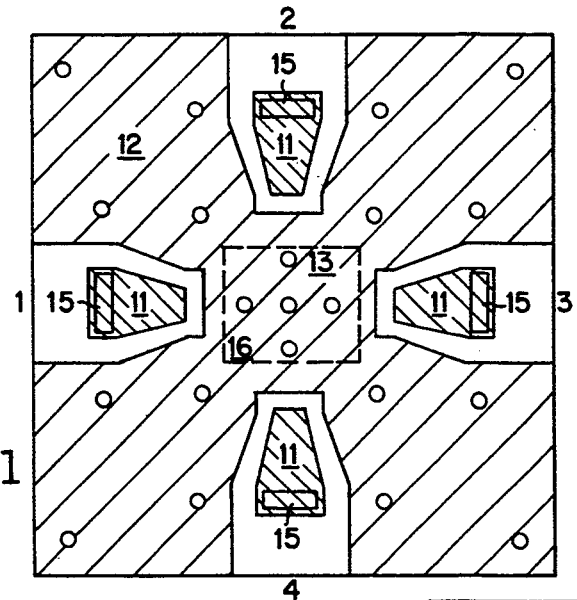
FIG. 1 shows the front-side layout of this invention.
Figure 2:
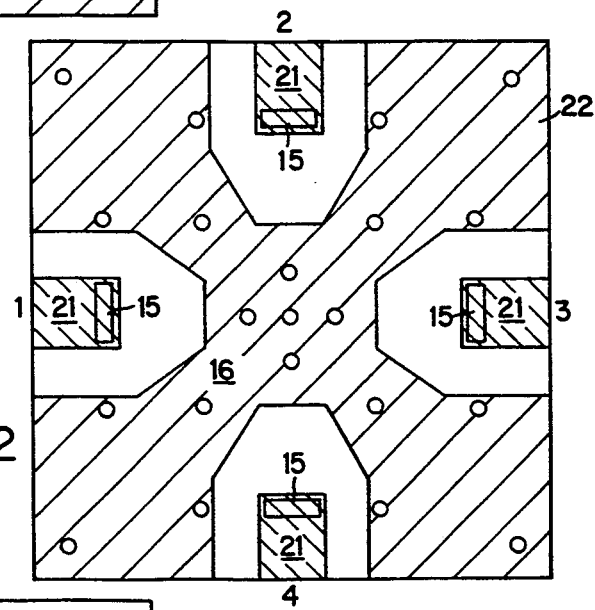
FIG. 2 shows the back-side layout of this invention.

Referring to FIG. 1 and FIG. 2, the printed circuits on the front-side and the back-side have ground planes 12 and 22 (45° crosshatched area) connected by a number of metal-filled circular holes 16. There are four I/O ports 1, 2, 3, 4. Each port includes an electrical signal line comprising three physical sections: a wire-bonding pad 11 on the front-side of the dielectric substrate, a soldering pad 21 on the back side of the dielectric substrate, and a metal-filled via slot 15 imbedded in the substrate and connecting the soldering pad and the wire-bonding pad. The MMIC is placed on the die cavity 13 of the front-side ground plane 12. The signal ports of the MMIC are wire-bonded to the wire-bonding pad 11 of the I/O ports of the package. The space between the crosshatched areas is the clear surface of the substrate. The metal portions can be fabricated with conventional thick-film or thin-film techniques. The metal can be gold, silver, copper, . . . etc, each having advantages and disadvantages. In this figure, the thick-film was used. The front-side metal is gold, and the back-side metal is silver. The reason why the thick-film technique is used is that the the thick-film technique is much cheaper than the thin-film technique. The front-side gold can easily be wire-bonded and is not erosive, but can easily be attacked by lead solder. Silver is used in the back-side, for it can avoid the attack of the soldering lead and the cost is lower than gold, but silver cannot easily be wire-bonded and can react with sulfer. Copper is a cheaper meterial and can hardly be attacked by solder, but is costly to fabricate and chemically reactive (or unstable). The material for the dielectric substrate can be any material suitable for microwave applications, such as alumina ($Al_2O_3$), alumina nitride, sapphire, quartz, etc., and other printed board materials such as Duroid, Teflon, etc. This example adopted 96% alumina as the base plate for its high dielectric constant (to reduce the circuit area), low loss, and rigidity. Alumminum nitride, sapphire and quartz also possess the advantages and therefore can also be used. Aluminum nitride has the additional advantage of having high thermal conductivity to dissipate heat.

The top view and side view of the shielding metal cap of this package is shown in FIG. 4(a), the top-view, and FIG. 4(b), the side-view. The cap is of the same size as the package and is constructed with brass, Kovar (an alloy of Fe, Co and Ni), alloy 42, etc. As shown in FIG. 4(a) metal cap has a hexagonal shape with eight vertical walls 43 which connect the central upper plate 42 to the four lower plates 41 as shown in FIG. 4(b) at the four corners. With these four lower plates 41, the cap is attached to the front-side ground of the package by Ag-Pt paste.

Figure 5:
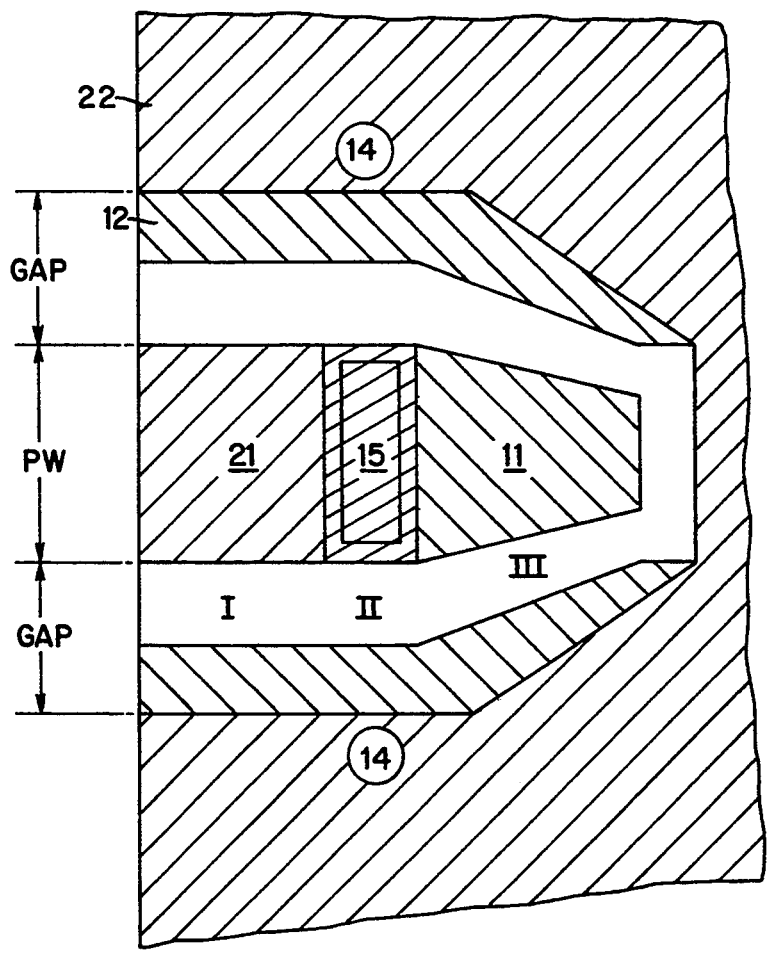
FIG. 5 shows a the single-port comprising section I, section II and section III according to this invention.

Figs. 5 and 6 shows the compensation structure of the distributed compensation I/O port in detail. FIG. 5 shows the overlay of the front-side and the back-side of a single-port structure. The 45° crosshatched areas 15, 21, 22 are the back-side metal, and the 135° crosshatched areas 11, 12, 15 are the front-side metal. By the metal-filled slot 15, the two signal lines 11 and 21 are connected, and by the metal-filled via holes 16 which are situated near and at the two sides of the slot with equal spacing, the two ground planes 12 and 22 are shorted. FIG. 6(b), FIG. 6(c) and FIG. 6(d) are the side views of section I, section II and section III in FIG. 5. The conventional structure of a coplanar waveguide (CPW) is shown in FIG. 6(a). The front-side of the substrate 63 is clear without any metal. On the other side, three parallel metal lines 61, 62 with equal spacing between them are printed. The central line 61 is the signal line, and the other two lines 62 are the ground planes. The electric fields distributed between them are confined in the substrate because the dielectric constant of alumina substrate is high. Once the dielectric constant and the depth of the substrate is chosen, the characteristic impedance is determined by the width of the central line and the spacing between 61 and 62. The narrower the spacing is, the larger is the distributed capacitance and the lower is the characteristic impedance. To provide a good adhesion of the soldering pad 21 and to prevent short-circuit, the I/O pad-width PW, as shown in FIG. 5, and its spacing GAP to ground plane 22 must be large enough to satisfy some commercial rules. Usually, PW is in the range between 1–1.2 mm; GAP between 0.8–1 mm. Under this rule, the spacing is too wide such that the characteristic impedance of the soldering pad 21 rises above 80 ohms which causes impedance mismatch and greatly degrades the package performance. To overcome this disadvantage, this invention utilizes two extended ground planes on the upper plane of the package to provide more distributed capacitance for the pad, thus reducing the characteristic impedance from 80 ohms to 50 ohms. Such an inventive distributed capacitance structure is shown in the section I of FIG. 5 and FIG. 6(b). The inventive structure is named as "compensated pseudo-CPW structure" since it is different from the conventional CPW structure in FIG. 6(a) or CPWG (CPW gated) structure.

Figure 6A:
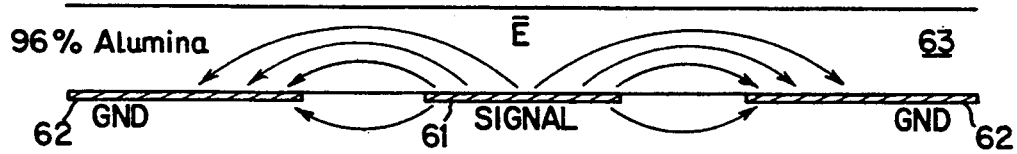
FIG. 6(a) shows a coplanar waveguide structure.
Figure 6B:
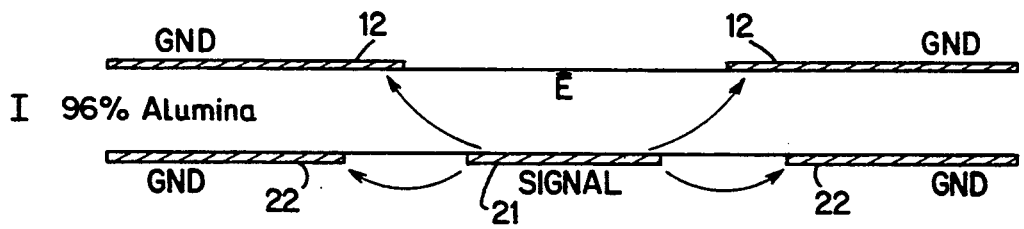
FIG. 6(b)–(d) are the side-views of section I, section II and section III in FIG. 5, which is an enlarged view of the input port 1 in FIG. 1.
Figure 6C:
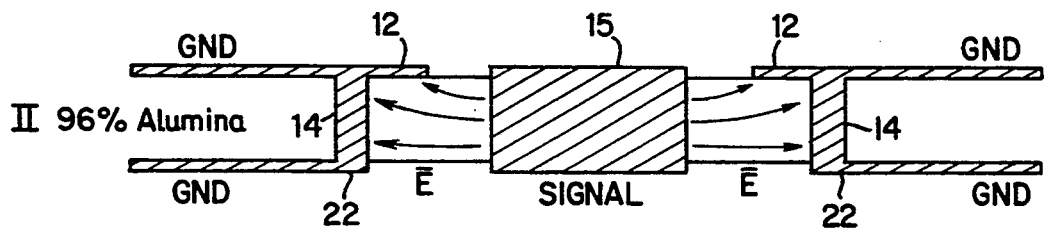
Figure 6D:
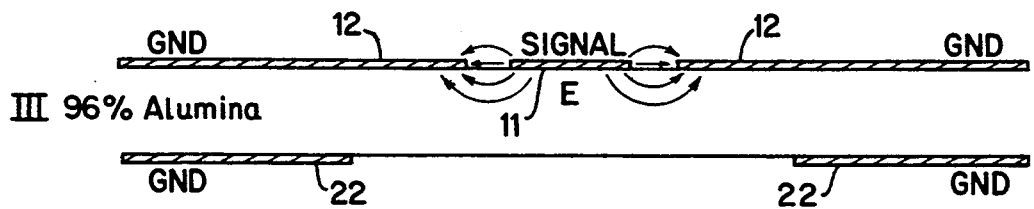

The other high-impedance element in conventional microwave package technology that degrades the performance of the package is the via hole, structure for connecting the signal line on the two sides of the substrate, which is equivalent to a pure inductor. There are two ways to compensate for this inductance so as to reduce the impedance to 50 ohms. On method is to reduce the inductance, and the other is to add distributed capacitance. Instead of using traditional circular via holes, this inventions uses broadened metal-filled via slot 15, as shown in FIG. 5, to simultaneously reduce the inductance and add more distributed capacitance as indicated in FIG. 6(c). Moreover, this structure uses two compensated ground holes 14 which short the two ground planes 12 and 22 and are situated near and at the two opposite two sides of the slot with equal spacing, as shown in FIG. 5 and FIG. 6(c), in parallel to the slot to increase the distributed capacitance of the slot 15. In FIG. 5, section III, a 50 ohm taper shaped wire-bonding pad on the front side of the plate is used. Section III is also formed as a pseudo-CPW structure as shown by the side-view in FIG. 6(d). As the gap between the signal line 11 and the ground 12 is narrow, the electric field is almost entirely confined in the gap, as indicated by the short electric lines E in FIG. 6(d). Thus, the effect from the back-side ground 22 can be ignored.

It has been demonstrated that this distributed compensation structure can render all the three sections of the signal line (pad 11 and 21, metal-filled via slot 15) to become the standard 50 ohm transmission line over broad frequencies, instead of performing like a low-pass filter as in most of the prior art.

Figure 7:
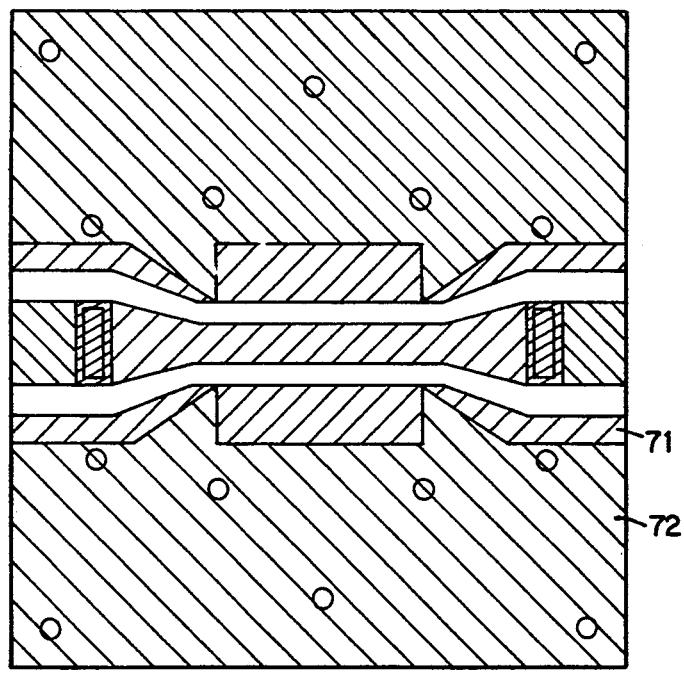
FIG. 7 shows the test circuit of this invention.
Figure 8:
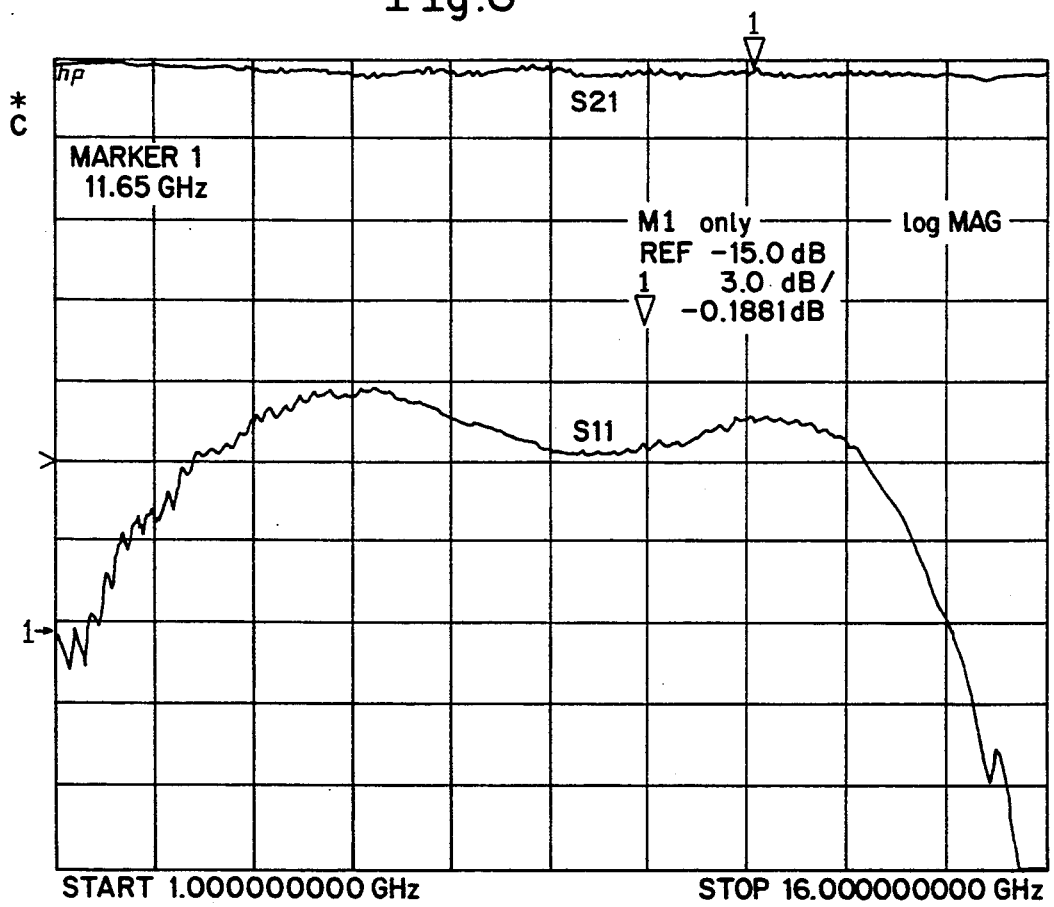
FIG. 8 shows the measured S-parameters S21 and S11 of this new structure.

FIG. 7 is the test circuit of this invention. The 45° crosshatched area 71 is the front-side layout and the 135° crosshatched area 72 is the back-side layout. The difference between the package and the test fixture is that the test fixture has an extra 50-ohm line for connecting two I/O ports. The other two ports are not used. The measured result is shown in FIG. 8. The measured frequency range is limited to 16 GHz due to the reliability of the system and SMA connectors. One can see that the average reflection coefficient (S11) is below −15 dB, and the average transmission coefficient (S21) is within −0.2 dB over a very broad bandwidth 1–16 GHz. In other words, the package is nearly lossless. In fact, the loss includes three types of losses:

1. loss from two I/O ports.
2. loss from the extra 50-ohms line.
3. loss from the two SMA connectors, which dominates the loss.

What is claimed is:

1. A surface mountable microwave package comprising:
    a dielectric plate,
    a first ground plane of metal printed on the front-side of said plate,
    a second ground plane of metal printed on the back-side of said plate,
    via holes in said plate for connecting the first ground plane to the second ground plane with metal,
    at least one input/output port having a signal line including a soldering pad of metal on the back-side of said plate, said soldering pad being isolated from said second ground plane with equal spacing at the two opposite sides of the soldering pad to form a coplanar waveguide structure on the back-side of said plate.
    said first ground plane having extension over said coplanar waveguide structure on the back side of said plate and a predetermined area without metal being left on the front-side of said plate over said soldering pad, for compensating the mismatch of the characteristic impedance of said soldering pad due to electrical discontinuity,
    said signal line further including a wire-bonding pad on the front-side of said plate, said wire-bonding pad being made of metal and being isolated from said first ground plane, and a metal-filled slot imbedded in said plate for connecting the wire-bonding pad and the soldering pad, said slot having a larger cross-section than said via-holes.

2. A surface mountable microwave package as described in claim 1, further comprising two compensation via holes filled with metal for connecting said first and second ground planes and situated in physical alignment with and at two opposite sides of the slot with equal spacing between said first and second ground planes so that the capacitance of said metal-filled via slot can be increased for compensating the mismatch of the characteristic impedance of said signal line due to electrical discontinuity.

3. A surface mountable microwave package as described in claim 1, wherein an integrated circuit chip is mounted on said first ground plane and wire-bonded to said wire-bonding pad.

4. A surface mountable microwave package as described in claim 1, wherein the gap between said wire-bonding pad and said first ground plane is tapered from a wider spacing near the slot to a narrower spacing away from the slot.

5. A surface mountable microwave package as described in claim 4, wherein the width of said wire-bonding pad is tapered from a wider width near the slot to a narrower width away from slot.

6. A surface mountable microwave package comprising:
- a dielectric plate,
- a first ground plane of metal printed on the front-side of said plate,
- a second ground plane of metal printed on the back-side of said plate,
- via holes in said plate for connecting the first ground plane to the second ground with metal,
- at least an input/output port having a signal line including a soldering pad of metal on the back-side of said plate, a wire-bonding pad of metal on the front-side of said plate, and a metal-filled via slot imbedded in said plate for connecting the wire-bonding pad and the soldering pad, said slot having a larger cross-section than said via holes;
- the impedance mismatch due to said wire-bonding pad, said soldering pad and said slot respectively being compensated by distributed capacitance with the first ground plane and the second ground plane to yield a matching impedance directly thereof.

* * * * *